(12) United States Patent
Del Croce et al.

(10) Patent No.: US 9,748,945 B2
(45) Date of Patent: Aug. 29, 2017

(54) COMMUNICATING WITH POWER SWITCHING DEVICES

(71) Applicant: Infineon Technologies AG, Neubiberg (DE)

(72) Inventors: Paolo Del Croce, Villach (AT); Robert Illing, Finkenstein (AT); Alexander Mayer, Treffen (AT)

(73) Assignee: Infineon Technologies AG, Neubiberg (DE)

( * ) Notice: Subject to any disclaimer, the term of this patent is extended or adjusted under 35 U.S.C. 154(b) by 491 days.

(21) Appl. No.: 14/526,164

(22) Filed: Oct. 28, 2014

(65) Prior Publication Data
US 2016/0118211 A1    Apr. 28, 2016

(51) Int. Cl.
*H03K 17/28*    (2006.01)
*H03K 17/18*    (2006.01)

(52) U.S. Cl.
CPC .............. *H03K 17/28* (2013.01); *H03K 17/18* (2013.01); *H03K 2217/0009* (2013.01)

(58) Field of Classification Search
CPC ...... H03K 17/18; H03K 17/28; H03K 17/284; H03K 17/292; H03K 17/94; H03K 2217/0081; H02H 1/0061; H02H 1/06
See application file for complete search history.

(56) References Cited

U.S. PATENT DOCUMENTS

| | | | | |
|---|---|---|---|---|
| 6,011,416 A * | 1/2000 | Mizuno | .............. | H03K 17/0822 327/108 |
| 6,633,469 B2 * | 10/2003 | Fukami | .................. | H03K 17/18 361/115 |
| 7,619,503 B2 * | 11/2009 | Joukou | .............. | H03K 17/0828 340/3.43 |
| 7,719,811 B2 * | 5/2010 | Brombach | ......... | H03K 17/0822 361/93.1 |
| 9,065,447 B2 * | 6/2015 | Buttolo | .................. | H03K 17/94 |
| 2003/0142449 A1 * | 7/2003 | Iwata | .................. | H02H 1/0015 361/58 |

OTHER PUBLICATIONS

"PROFET™ + 12V, BTS5020-1EKA, Smart High-Side Power Switch, Single Channel, 20mΩ," Infineon Data Sheet, Rev. 2.2, Nov. 12, 2013, 55 pp.
"BTS5242-2L, Smart High-Side Power Switch," Infineon Data Sheet, Rev. 1.2, Sep. 2008, 24 pp.
"SPOC™ + 12V, BTS54220-LBA, SPI Power Controller," Infineon Data Sheet, Rev. 2.0, May 26, 2014, 71 pp.

* cited by examiner

*Primary Examiner* — Ryan Johnson
(74) *Attorney, Agent, or Firm* — Shumaker & Sieffert, P.A.

(57) ABSTRACT

In one example, a method includes receiving, at a first time by a power switching device via an input connector of the power switching device, a signal that causes the power switching device to output a power signal to a load via an output connector of the power switching device. In this example, a voltage level of the power signal satisfies a voltage threshold at a second time that is later than the first time. In this example, the method also includes communicating, by the power switching device and during a time period between the first time and the second time, with an external device via the input connector.

20 Claims, 5 Drawing Sheets

COMMUNICATING WITH POWER SWITCHING DEVICES

TECHNICAL FIELD

This disclosure relates to communicating with power switching devices.

BACKGROUND

Power switching devices may be used to control the amount of power provided to loads. A power switching device may include a plurality of connectors (i.e., pins) that are used to transport signals from the power switch device to one or more external devices. For instance, a power switching device may have an input pin configured to receive an activation signal, and an output pin configured to output a power signal to a load.

In some examples, a controller may be used to control the operation of one or more power switching devices. As one example, a controller may be configured to output an activation signal to an input connector of a power switching device to cause the power switching device to output a power signal to a load via its output connector. As another example, a power switching device may include a feedback connector configured to output a feedback signal that corresponds to a power signal output the by the output connector of the power switching device. In some examples, the controller may monitor the feedback signal to determine how much power is being provided to the load. In some examples, it may be desirable for a controller to communicate additional information with a power switching device. For instance, as opposed to only receiving an activation signal and providing a feedback signal, it may be desirable for a power switching device to exchange additional information with the controller.

SUMMARY

In general, this disclosure is directed to power switching devices that utilize techniques for communicating with an external device. For example, a power switching device may be configured to communicate with an external device via one or more connectors that are configured to both carry signals for a general purpose communication bus and operate as signal-specific connectors.

In one example, a method includes receiving, at a first time by a power switching device via an input connector of the power switching device, a signal that causes the power switching device to output a power signal to a load via an output connector of the power switching device, wherein a voltage level of the power signal satisfies a voltage threshold at a second time that is later than the first time. In this example, the method also includes communicating, by the power switching device and during a time period between the first time and the second time, with an external device via the input connector.

In another example, a power switching device includes an input connector configured to receive, at a first time, a signal that causes the power switching device to output a power signal, a driver configured to generate the power signal, wherein a voltage level of the power signal satisfies a voltage threshold at a second time that is later than the first time, and an output connector configured to output the power signal to a load. In this example, the power switching device also includes a communication module configured to communicate, during a time period between the first time and the second time, with an external device via the input connector.

In another example, a power switching device includes means for generating a power signal, wherein a voltage level of the power signal satisfies a voltage threshold at a second time that is later than a first time; means for receiving, at the first time, a signal that causes the power switching device to output the power signal; means for outputting the power signal to a load; and means for communicating, during a time period between the first time and the second time, with an external device via the means for receiving.

The details of one or more examples of the disclosure are set forth in the accompanying drawings and the description below. Other features, objects, and advantages will be apparent from the description and drawings, and from the claims.

DETAILED DESCRIPTION

In general, this disclosure is directed to power switching devices that utilize techniques for communicating with an external device. In some examples, a power switching device may communicate with an external device using one or more signal specific connectors. For instance, a power switching device may receive an activation signal at an input connector, and output a feedback signal at a feedback connector. In some examples, a power switching device may communicate with an external device using a general purpose communication bus. For instance, a power switching device may exchange data, which may include an activation signal and a feedback signal, with an external device via a Serial Peripheral Interface (SPI) bus, an Inter-Integrated Circuit (I2C) bus, a Controller Area Network (CAN) bus, Universal Serial Bus (USB), or any other suitable communication bus. By communicating via a general purpose communication bus, the power switching device and the external device may exchange a wider variety of data. For instance, in addition to receiving the activation signal, the power switching device may receive one or more operational settings from the external device.

However, in some examples, it may be undesirable for a power switching device to communicate solely via a general purpose communication bus. For instance, in certain applications, such as automotive application, safety considerations may require that the power switching device be activated via a signal-specific connector. As one example, where a power switching device is used to provide power to exterior lights on a vehicle, the ISO 26262 standard requires that the power switching device be configured to receive an activation signal via a signal specific connector (i.e., in a "limp home" mode). As such, in some examples, a power switching device may include a plurality of connectors that carry signals for a general purpose communication bus and one or more signal-specific connectors that receive or output specific signals.

However, in some examples, it may not be desirable for a power switching device to include both a plurality of connectors that carry signals for a general purpose communication bus and one or more signal-specific connectors that receive or output specific signals. In accordance with one or more techniques of this disclosure, a power switching device may include one or more connectors configured to both carry signals for a general purpose communication bus and operate as signal-specific connectors. In this way, the power switching device may achieve both the benefits of communication via a general purpose communication bus and the benefits of having signal-specific connectors.

In some examples, the plurality of connectors may be configured to both carry signals for a general purpose communication bus and operate as signal-specific connectors by taking advantage of a delay time intrinsic to the power switching device. For instance, there may be a delay ($t_{delay(ON)}$) between a first time at which a power switching device receives a signal, via an input connector, that causes the power switching device to output a power signal to a load (i.e., an activation signal), and a second time at which a level of the power signal (i.e., a voltage level or a current level) satisfies a threshold (i.e., a voltage threshold or a current threshold).

In accordance with one or more techniques of this disclosure, the power switching device may communicate with an external device via the input connector during a delay of the power switching device. For instance, the power switching device may use the input connector to carry signals of a general purpose communication bus during a time period between the first time (i.e., when the signal that causes the power switching device to output the power signal is received) and the second time (i.e., when the level of the power signal satisfies a threshold). In this way, the power switching device may include one or more connectors configured to both carry signals for a general purpose communication bus and operate as signal-specific connectors.

Figure 1:
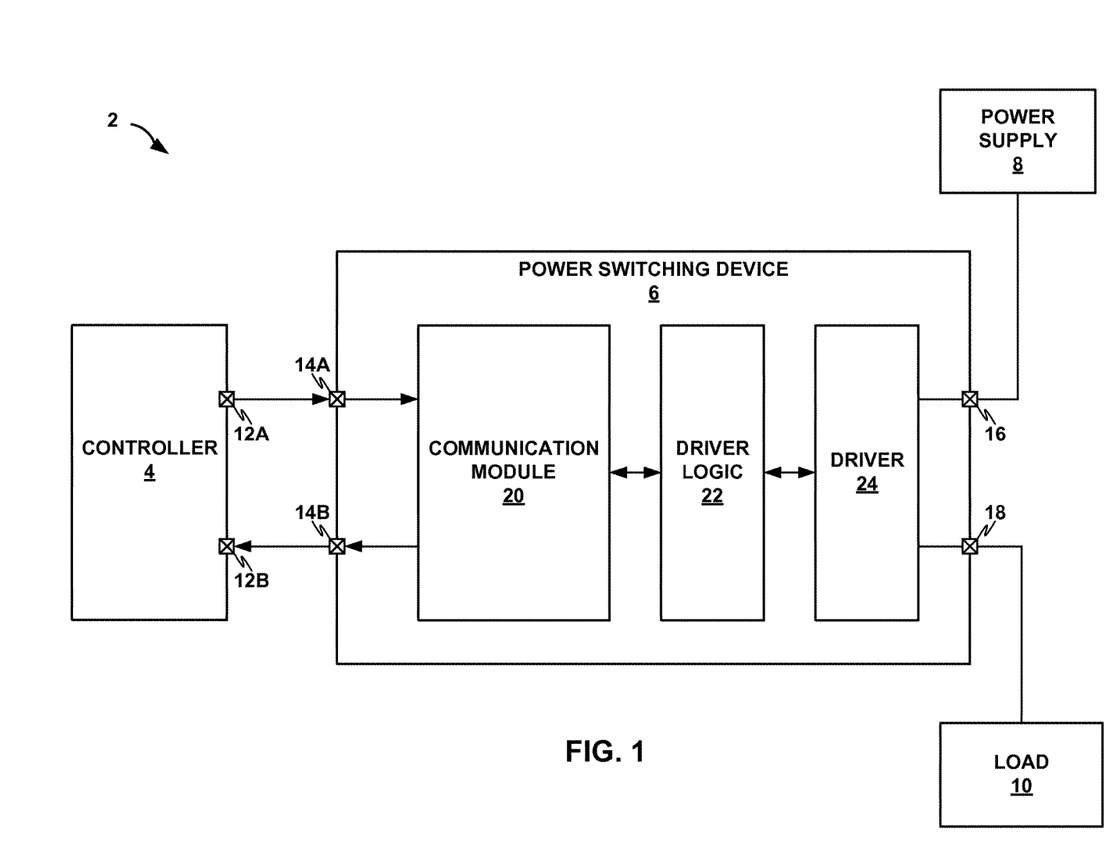
FIG. 1 is a conceptual diagram illustrating an example system that includes a power switching device configured to communicate with an external device via one or more connectors that are configured to both carry signals for a general purpose communication bus and operate as signal-specific connectors, in accordance with one or more exemplary techniques of this disclosure.

FIG. 1 is a conceptual diagram illustrating an example system that includes a power switching device configured to communicate with an external device via one or more connectors that are configured to both carry signals for a general purpose communication bus and operate as signal-specific connectors, in accordance with one or more exemplary techniques of this disclosure. As illustrated in FIG. 1, system 2 includes controller 4, power switching device 6, power supply 8, and load 10.

In some examples, system 2 may include controller 4, which may be configured to communicate with power switching device 6. As one example, controller 4 output an activation signal to power switching device 6 to cause power switching device 6 to output a power signal to load 10. In some examples, the activation signal may be a logical signal (e.g., an active high signal where logic high causes power switching device 6 to output the power signal, or an active low signal where logic low causes power switching device 6 to output the power signal). As another example, controller 4 may receive, from power switching device 6, a feedback signal that represents the power signal. In some examples, the feedback signal may represent a current level of the power signal. Examples of controller 4 may include, but are not limited to, one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components.

As illustrated in FIG. 1, controller 4 may include connectors 12A and 12B (collectively, "connectors 12") which may be connected to power switching device 6 via respective traces, wires, or any other suitable interconnection. While illustrated in the example of FIG. 1 as having two connectors (i.e., connector 12A and connector 12B), in some examples, connectors 12 may include any number of connectors. For instance, connectors 12 may include three connectors, four connectors, etc.

In some examples, connectors 12 may operate as signal-specific connectors. As one example, controller 4 may output the activation signal to power switching device 6 via connector 12A. As another example, controller 4 may receive the feedback signal from power switching device 6 via connector 12B. In some examples, connectors 12 may operate as connectors of a general purpose communication bus. For example, controller 4 may output the activation signal to power switching device 6 and receive the feedback signal from power switching device 6 via a general purpose communication bus carried by connectors 12.

In some examples, system 2 may include power supply 8, which may be configured to output power to one or more components of system 2. Examples of power supply 8 may include, but are not limited to, batteries, power converters (e.g., DC/DC converters, AC/DC converters, AC/AC converters, and/or DC/AC converters). For instance, in automotive applications, power supply 8 may include a car battery configured to provide approximately 10V-18V and the needed current to power the one or more components of system 2.

In some examples, system 2 may include load 10 which may be configured to receive power from power switching device 6. In some examples, load 10 may include one or more light emitting devices (e.g., one or more light bulbs, one or more light emitting diodes (LEDs), one or more laser diodes, and the like), one or more batteries, one or more computing devices, one or more resistive devices, one or more capacitive devices, one or more inductive devices, any other device that uses electrical power, or any combination of the same. As illustrated in FIG. 1, load 10 may be connected to power output connector 18 of power switching device 6 such that power switching device 6 may be a high-side driver with respect to load 10.

As illustrated in FIG. 1, system 2 includes power switching device 6, which may be configured to control the amount of current flowing through load 10. In some examples, power switching device 6 includes connectors 14A and 14B (collectively, "connectors 14"), power input connector 16, power output connector 18, communication module 20, driver logic 22, and driver 24. Examples of power switching device 6 include, but are not limited to, integrated circuits, and discrete components.

In some examples, power switching device 6 may include connectors 14 which may be configured to receive and/or output communication signals between power switching device 6 and one or more external devices, such as controller 4. As illustrated in FIG. 1, connector 14 may be connected to controller 4 via respective traces, wires, or any other suitable interconnection. While illustrated in the example of FIG. 1 as having two connectors (i.e., connector 14A and connector 14B), in some examples, connectors 14 may include any number of connectors. For instance, connectors 14 may include three connectors, four connectors, etc.

In some examples, power switching device 6 may include power input connector 16 and power output connector 18, which may be configured to receive and/or output power signals. For instance, power input connector 16 may be configured to receive a power signal from power supply 8 and power output connector 18 may be configured to output a power signal to load 10.

In some examples, power switching device 6 may include input connector 16, and output connector 18. In some examples, one or more of connector 14, power input connector 16, and power output connector 18 may be high voltage interface connectors. In this way, one or more of connector 14, power input connector 16, and power output connector 18 may comply with one or more safety requirements, such as ISO26262 and/or IEC61508.

In some examples, power switching device 6 may include driver logic 22, which may be configured to output a signal to control one or more drivers. For instance, driver logic 22 may output a control signal to the gate of driver 24. In some examples, driver logic 22 may output the control signal based on a signal received from one or more other components of system 2, such as a control signal received from controller 4. In some examples, driver logic 22 may perform one or more operations to protect the functionality of driver 24. As one example, driver logic 22 may deactivate driver 24 if the temperature of driver 24 exceeds a temperature threshold. As another example, driver logic 22 may deactivate driver 24 if the current level of the power signal generated by driver 24 exceeds a current threshold.

In some examples, power switching device 6 may include driver 24, which may be configured to provide power to drive a load based on a control signal. For instance, driver 24 may generate a power signal to drive load 10 via power output connector 18 based on a control signal received from driver logic 22. In some examples, driver 24 may include one or more components to provide feedback to driver logic 22. For instance, driver 24 may include a temperature sensor configured to provide an indication of the temperature of driver 24 to driver logic 22, a current sensor configured to provide an indication of the current level of the power signal to driver logic 22, and/or a voltage sensor configured to provide an indication of the voltage level of the power signal to driver logic 22.

In some examples, driver 24 may include one or more power transistors, one or more metal-oxide-semiconductor field-effect transistors (MOSFETs), one or more thyristors, one or more insulated-gate bipolar transistors (IGBTs), and/or a combination of the same. Some example MOSFETs that may be included in driver 24 include, but are not limited to, one or more double-diffused metal-oxide-semiconductor (DMOS) MOSFETs, one or more P-substrate (PMOS) MOSFETs, one or more trench (UMOS) MOSFETS, and one or more super-junction deep-trench MOSFETs (e.g., one or more CoolMOS™ MOSFETs).

In some examples, power switching device 6 may include communication module 20, which may be configured to communicate with one or more external devices via connectors 14. For instance, communication module 20 may communicate with controller 4 via connector 14. In some examples, communication module 20 may communicate with controller 4 by utilizing connectors 12 as signal-specific connectors. As one example, communication module 20 may receive an activation signal from controller 4 via connector 14A. As another example, communication module 20 may output a feedback signal to controller 4 via connector 14B. In some examples, communication module 20 may communicate with controller 4 by utilizing connectors 12 as connectors of a general purpose communication bus. For example, communication module 20 may receive the activation signal from controller 4 and output the feedback signal to controller 4 via a general purpose communication bus carried by connectors 14.

In accordance with one or more techniques of this disclosure, as opposed to communicating with controller 4 by using connectors 14 as either signal-specific connectors or connectors of a general purpose communication bus, communication module 20 may communicate with controller 4 by using connectors 14 as both signal-specific connectors and connectors of a general purpose communication bus. In this way, the power switching device may achieve both the benefits of communication via a general purpose communication bus and the benefits of having signal-specific connectors.

Figure 2:
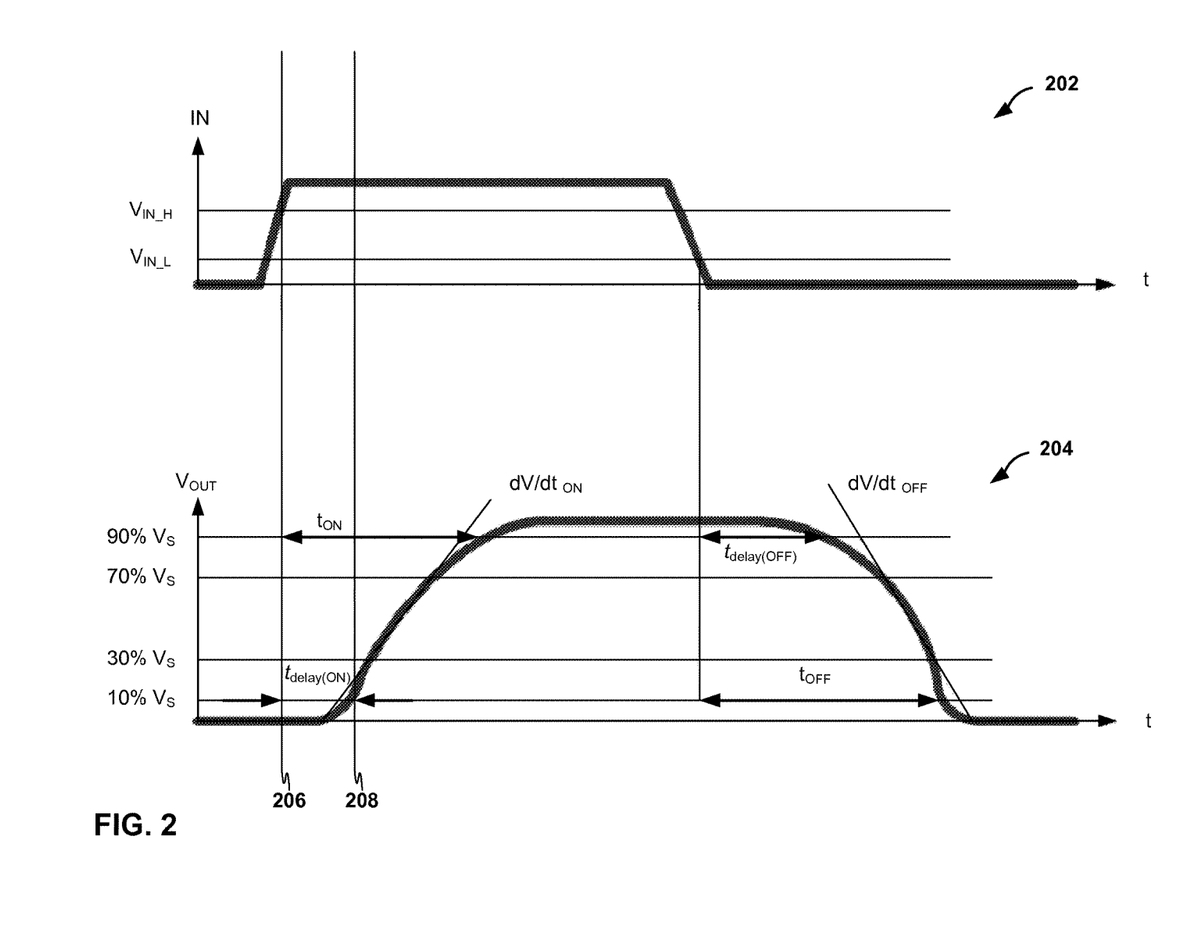
FIG. 2 is a graph illustrating example signals of a power switching device, in accordance with one or more exemplary embodiments of this disclosure.

FIG. 2 is a graph illustrating example signals of a power switching device, in accordance with one or more exemplary embodiments of this disclosure. As illustrated in FIG. 2, graph 202 may include a horizontal axis representing time, a vertical axis representing voltage, and a plot represent a voltage signal. In some examples, the voltage signal may represent the voltage level of a connector (such as connector 14A of power switching device 6 of FIG. 1). Also as illustrated in FIG. 2, graph 204 may include a horizontal axis representing time, a vertical axis representing voltage, and a plot represent a voltage signal. In some examples, the voltage signal may represent the voltage level of a connector (such as power output connector 18 of power switching device 6 of FIG. 1).

In accordance with one or more techniques of this disclosure, an input connector of a power switching device may receive, at first time 206, a signal that causes the power switching device to output a power signal to a load via an output connector of the power switching device. For instance, connector 14A of power switching device 6 of FIG. 1 may receive an activation signal that causes driver 24 of power switching device 6 to output a power signal to load 10 via power output connector 18 of power switching device 6.

In response to receiving the signal at the input connector, the power switching device may begin to output the power signal to the load via the output connector. A level, such as a voltage or current level, of the power signal may begin to rise and may satisfy a threshold (e.g., 10% of its final level) at second time 208. However, due to the nature of the power switching device, there may be a delay a $t_{delay(ON)}$) between first time 206 and second time 208. As illustrated by graph 202, the voltage level of the signal that causes the power switching device to output the power signal may remain high throughout the period between first time 206 and second time 208.

Referring now to FIGS. 1 and 2, driver logic 22 may receive, via a particular connector of connectors 12 and at first time 206, an activation signal requesting that power switching device 6 output a power signal to load 10. Responsive to receiving the activation signal, driver logic 22 may cause driver 24 to begin outputting the power signal such that a voltage level of the power signal begins to rise and satisfies a voltage threshold at second time 208.

In accordance with one or more techniques of this disclosure, communications module 20 may communicate with controller 4 via the particular connector of connectors 14 during a period between first time 206 and second time 208. For instance, communications module 20 may exchange data with controller 4 via a general purpose communications bus that includes the particular connector of connectors 14 during the period between first time 206 and second time 208. In other words, during the period between first time 206 and second time 208 the particular connector of connectors 14 may be used to carry a signal of an SPI, an I2C, a CAN, a USB, or any other suitable communication bus. In this way, techniques of this disclosure enable the use of a single connector as both a signal-specific connector and a connector of a general purpose communication bus.

In some examples, communication module 20 may communicate with controller 4 in response to receiving, via the particular connector of connectors 14, a signal that indicates that controller 4 is attempting to communicate with power switching device 6. For instance, as opposed to outputting a static voltage signal, such as the voltage signal illustrated by graph 202, controller 4 may output a dynamic signal. As one example, controller 4 may toggle the voltage level of the signal received at the particular connector of connectors 14.

In some examples, communications module 20 may pass the signals received at connectors 14 to driver logic 22 unmodified. In some examples, such as where communication module 20 receives the signal that indicates that controller 4 is attempting to communicate with power switching device 6, communication module 20 may modify the signals received at connectors 14. For instance, communication module 20 may modify the signal received at the particular connector of connectors 14 such that driver logic 22 receives a static version of the signal. In this way, communication module 20 may receive the signal that indicates that controller 4 is attempting to communicate with power switching device 6 without said signal interfering with the operation of driver logic 22.

In some examples, communications module 20 may communicate with control 4 by receiving data. In some examples, communication module 20 may cause driver logic 22 to modify one or more operational settings based on the received data. Some example operational setting that may be modified based on the received data include, but are not limited to, a current limit of the power signal, a slew-rate of the power signal, a ratio of a current feedback signal to a current level of the power signal, and one or more fault behavior settings. In this way, techniques of this disclosure may enable the modification of operational settings that, without the availability of a general purpose communication bus, may be unmodifiable.

In any case, controller 4 and communication module 20 may cease communicating at or before second time 208. As one example, the duration of the period between first time 206 and second time 208 may be a predetermined value and controller 4 may be configured to cease communicating with communication module 20 at or before second time 208. As another example, such as where the general purpose communication bus includes a clock signal, controller 4 may be configured to only communicate with communication module 20 for a period of time defined by a quantity of clock cycles of the communication bus (e.g., 64/32/16/8 clock cycles).

Figure 3:
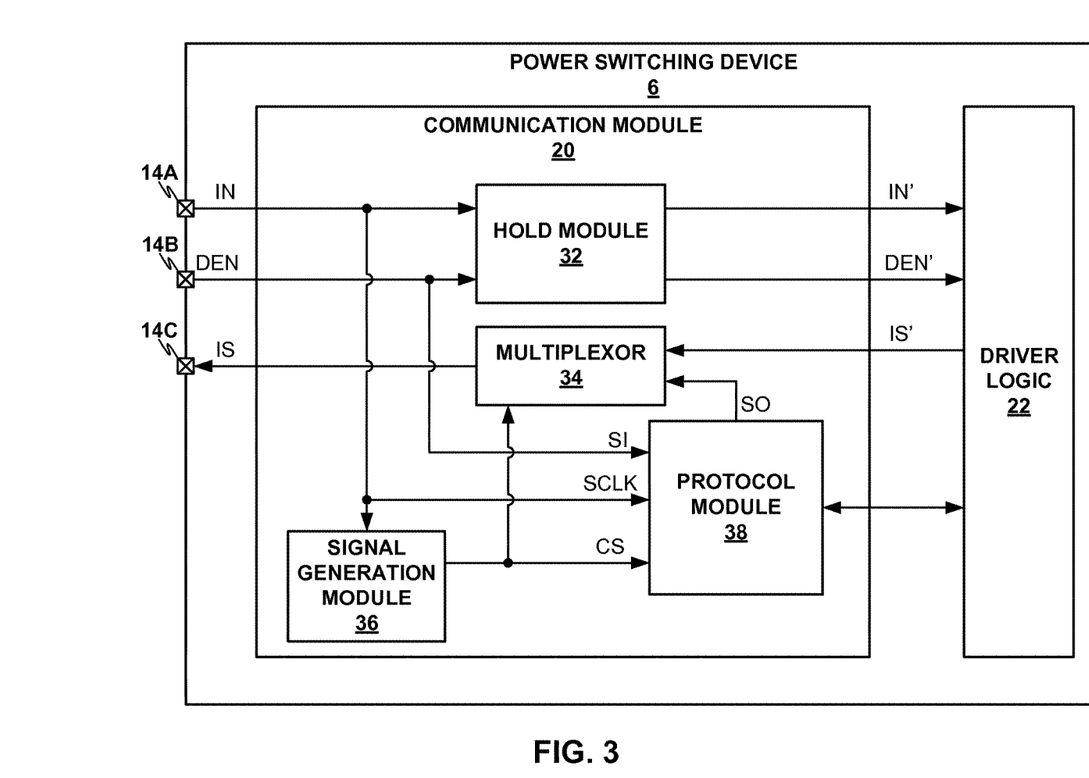
FIG. 3 is a conceptual diagram illustrating further details of power switching device 6 of FIG. 1 that is configured to communicate with an external device via one or more connectors that are configured to both carry signals for a general purpose communication bus and operate as signal-specific connectors, in accordance with one or more exemplary techniques of this disclosure.

FIG. 3 is a conceptual diagram illustrating further details of power switching device 6 of FIG. 1 that is configured to communicate with an external device via one or more connectors that are configured to both carry signals for a general purpose communication bus and operate as signal-specific connectors, in accordance with one or more exemplary techniques of this disclosure. As illustrated in FIG. 3, communication module 20 includes hold module 32, multiplexor 34, signal generation module 36, and protocol module 38. Also as illustrated in FIG. 3, communication module 20 may be connected to connectors 14A-14C (collectively, "connectors 14"). In some examples, connector 14A may be an input connector configured to receive a signal (IN) that causes power switching device 6 to output a power signal. In some examples, connector 14B may be a diagnostic connector configured to receive a signal (DEN) that causes power switching device 6 to modify operation of a feedback connector, such as feedback connector 14C. In some examples, connector 14C may be a feedback connector configured to output a representation (IS) of the power signal generated by power switching device 6. For instance, connector 14 may output a current that is proportional to the current of the power signal generated by driver 24. In some examples, the ratio of the current output by connector 14 and the current of the power signal generated by driver 24 may be referred to as $K_{ILIS}$.

In some examples, communication module 20 may include hold module 32, which may be configured to hold a level of an output signal for a period of time. For instance, responsive to receiving an input signal that is high, hold module 32 may generate an output signal that is high for a period of time such that the output signal will remain high even if the input signal goes low during the period of time. In some examples, hold module 32 may reset the period of time such that the output signal will remain high for the period of time after the input signal goes low. For instance, if the input signal is high from a first time (T1) until a second time (T2), hold module 32 may generate the output signal as high until T2 plus the period of time, at which point hold module 32 may generate the output signal as logic low (assuming that the input signal remains logic low throughout the period of time). In some examples, hold module 32 may be configured to hold the levels of a plurality of output signals based on a plurality of input signals, for instance, responsive to receiving an first input signal that is high, hold module 32 may generate a first output signal that is high for a period of time such that the first output signal will remain high even if the first input signal goes low during the period of time, and generate a second output signal that is high for a period of time such that the second output signal will remain high even if the second input signal goes low during the period of time. In some examples, hold module 32 may output the generated output signals to one or more components of power switching device 6, such as driver logic 22.

In some examples, communication module 20 may include multiplexor 34, which may be configured to generate an output signal based on a plurality of input signals and a control signal. For instance, responsive to receiving a control signal that corresponds to a particular input signal of the plurality of input signals, multiplexor 34 may pass the particular input signal as the output signal. In this example of FIG. 3, multiplexor 34 may be configured to generate output signal IS by passing either first input signal IS' or second input signal SO based on control signal CS. In some examples, multiplexor 34 may output the generated output signal to one or more components of power switching device 6, such as a connector of connectors 14.

In some examples, communication module 20 may include signal generation module 36, which may be configured to generate an output signal based on an input signal. For instance, signal generation module 36 may generate output signal CS based on input signal IN. As one example, if input signal IN matches a particular pattern, signal generation module 36 may generate output signal CS as high. In some examples, signal generation module 36 may output signal CS to one or more components of communication module 20, such as multiplexor 34 and/or protocol module 38.

In some examples, communication module 20 may include protocol module 38, which may be configured to implement one or more communication protocols. Some communication protocols that may be implemented by protocol module 38 include, but are not limited to, SPI, I2C, CAN, USB, and any other suitable communication protocol. In some examples, such as in the example of FIG. 3, protocol module 38 may implement the SPI communication protocol which includes four signals: serial clock (SCLK), slave input (SI), slave output (SO), and chip select (CS). In some examples, protocol module 38 may be configured to output data, such as one or more operational settings, to one or more components of power switching device 6, such as driver logic 22.

Figure 4:
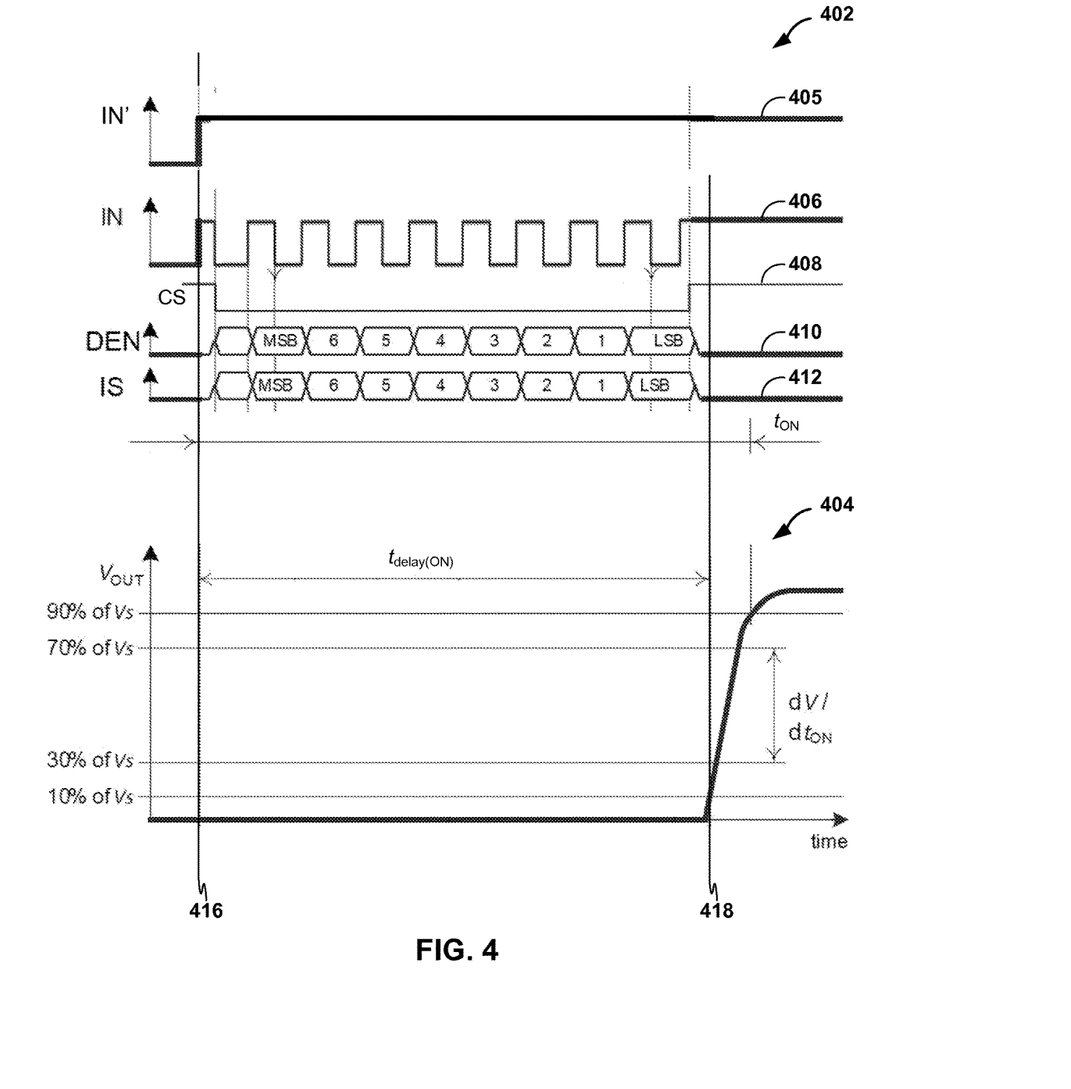
FIG. 4 is a graph illustrating example signals of a power switching device, in accordance with one or more exemplary embodiments of this disclosure.

FIG. 4 is a graph illustrating example signals of a power switching device, in accordance with one or more exemplary embodiments of this disclosure. As illustrated in FIG. 4, graph 402 may include a horizontal axis representing time, and a plurality of plots 406-412 representing a plurality of logical signals. In some examples, the logical signal represented by plot 405 may be a logical representation of modified version of a signal received by a connector of a power switching device (such an output signal of hold module 32 that corresponds to the signal received via connector 14A of power switching device 6 of FIG. 3). In some examples, the logical signal represented by plot 406 may be a logical representation of a signal received by a connector of a power switching device (such as connector 14A of power switching device 6 of FIG. 3). In some examples, the logical signal represented by plot 412 may be a logical representation of a signal generated by a component of a power switching device (such as signal generation module 36 of power switching device 6 of FIG. 3). In some examples, the logical signal represented by plot 410 may be a logical representation of a signal received by a connector of a power switching device (such as connector 14B of power switching device 6 of FIG. 3). In some examples, the logical signal represented by plot 412 may be a logical representation of a signal output by a connector of a power switching device (such as connector 14C of power switching device 6 of FIG. 3).

Also as illustrated in FIG. 4, graph 404 may include a horizontal axis representing time, a vertical axis representing voltage, and a plot represent a voltage signal. In some examples, the voltage signal may represent the voltage level of a connector (such as power output connector 18 of power switching device 6 of FIG. 1).

Referring now to FIGS. 1-4, in operation, communication module 20 may receive, via an input connector (e.g., connector 14A) and at first time 416, a signal requesting that driver 24 output a power signal to load 10. For instance, the voltage level at the input connector may transition from logical low to logical high. Prior to the first time, power switching device 6 may be in a deactivated state where the signal at the input connector does not cause driver 24 to output a power signal to load 10. For instance, the voltage level at the input connector may be logical low.

In any case, hold module 32 may generate an output signal based on the signal received via the input connector, and output the generated output signal to driver logic 22. For instance, as illustrated by FIG. 4, responsive to input signal IN becoming logical high, hold module 32 may generate signal IN' as logical high. Responsive to receiving a signal IN' as logical high, driver logic 22 may cause driver 24 to begin to output the power signal to load 10. As discussed above, there may be a delay from the time driver logic 22 causes driver 24 to begin to output the power signal to load 10 and the time at which a voltage level of the power signal satisfies a voltage threshold. For instance, as illustrated by graph 404, there is a delay of $t_{delay(ON)}$ from time 416 where driver logic 22 may cause driver 24 to begin to output the power signal to load 10 and time 418 where the voltage level of the power signal satisfies a voltage threshold (e.g., 10% of the final voltage level of the power signal).

In accordance with one or more techniques of this disclosure, communication module 20 may communicate with an external device, such as controller 4, during a time period between the time driver logic 22 causes driver 24 to begin to output the power signal to load 10 and the time at which a voltage level of the power signal satisfies a voltage threshold. In some examples, communications module 20 may communicate with the external device in response to receiving, via the input connector, a signal that indicates that the external device is attempting to communicate with power switching device 6. In some examples, the signal that causes power switching device 6 to output the power signal to load 10 may be a static signal, and the signal that indicates that the external device is attempting to communicate with power switching device 6 may be is a dynamic signal. In some examples, communications module 20 may determine that the signal received at the input connector indicates that the external device is attempting to communicate with power switching device 6 if the logical level of the signal toggles (e.g., low-high-low) within a period of time. For instance, as illustrated by graph 402, the logical level of the IN signal received by communications module 20 via connector 14A, may toggle low-high-low with the first low being before time 416.

Responsive to receiving the signal that indicates that the external device is attempting to communicate with power switching device 6, signal generation module 36 may generate signal CS to indicate that the external device is attempting to communicate with power switching device 6. In some examples, such the example of FIG. 4 where signal CS is an active low signal, signal generation module 36 may generate signal CS as logic low to indicate that the external device is attempting to communicate with power switching device 6. In some examples, such as where signal CS is an active high signal, signal generation module 36 may generate signal CS as logic high to indicate that the external device is attempting to communicate with power switching device 6.

Responsive to receiving signal CS as indicating that the external device is attempting to communicate with power switching device 6, multiplexor 34 may pass signal SO from protocol module 38 to connector 14C, and protocol module 38 may begin communicating with the external device. As one example, as illustrated by plot 410 of FIG. 4, protocol module 38 may receive an eight-bit byte of input data via the diagnostic connector (e.g., connector 14B). As another example, as illustrated by plot 412 of FIG. 4, protocol module 38 may output an eight-bit byte of output data via the feedback connector (e.g., connector 14C).

In some examples, protocol module 38 may be configured to communicate with the external device using an N signal communication protocol via N−1 connectors of power switching device 6. For instance, as illustrated in the example of FIG. 3, protocol module 38 may communicate with the external device using a four signal (i.e., N=four) communication protocol (i.e., SPI) via connectors 14A-14C (i.e., N−1 or three connectors). In some examples, a signal of the N signal communications protocol that is not associated with the N−1 connectors may be internally generated by power switching device 6. For instance, as illustrated in the example of FIG. 3, signal generation module 36 may generate the CS signal of the SPI communication protocol and the CS signal may not be associated with any of connectors 14A-14C. In this way, design of protocol module 38 may be simplified as an off-the-shelf design may be used (e.g., an off-the-shelf SPI protocol module).

In some examples, one of the signals of the communications protocol used by protocol module 38 may be a clock signal. In some examples, as opposed to using an additional connector for the clock signal, protocol module 38 may use the signal at the input connector as the clock signal. For instance, protocol module 38 may use the signal that indicates that the external device is attempting to communicate with the power switching device as the clock signal of the communication protocol. In this way, communication module 20 may utilize a single signal received via a single connector to both determine that the external device is attempting to communicate with power switching device 6 and as a clock signal while communicating with the external device.

As discussed above, even though protocol module 38 may use one or more of connectors 14 to communicate with the external device, one or more components of communication module 20 may output signals to driver logic 22 such that the operation of driver logic 22 is not substantially affected by the communications. For instance, as discussed above, hold module 32 may generate signals IN' and/or DEN' based on the received signals IN and/or DEN such that the levels are held at a particular logic level for a period of time. In some examples, the period of time for which hold module 32 holds the logic levels may be selected based on a frequency of a clock signal. For instance, where a frequency of the SCLK clock signal is $f_{CK}$, hold module 32 may hold the level of the IN' and/or DEN' signals for a period of time greater than or equal to $1/f_{CK}$. As the logic level of signal IN/SCLK will be high during any period of time greater than or equal to $1/f_{CK}$, hold module 32 may cause signals at driver logic 22 to remain stable during communication. While hold module 32 may cause a delay of $1/f_{CK}$ from the time the signal IN becomes logic low until the signal IN' becomes, this delay may be insignificant because $f_{CK}$ may be significantly (i.e., several orders of magnitude) higher than a frequency at which power switching device 6 may be activated/deactivated (i.e., a load switching frequency).

In any case, the external device and communication module 20 may cease communicating at or before second time 418. As one example, the duration of the period between first time 416 and second time 418 may be a predetermined value and the external device may be configured to cease communicating with communication module 20 at or before second time 418. As another example, such as where the general purpose communication bus includes a clock signal, the external device may be configured to only communicate with communication module 20 for a period of time defined by a quantity of clock cycles of the communication bus (e.g., 64/32/16/8 clock cycles).

In some examples, communication module 20 may determine that the external device has ceased communicating in response to ceasing to receive the signal that indicates that the external device is attempting to communicate with communication module 20. For instance, responsive to determining that the logic level of at the input connector has not toggled for a particular period of time (i.e., $2/f_{CK}$) signal generation module 36 may output the CS signal with a logic level that indicates that the external device is not attempting to communicate with power switching device 6. Responsive to the CS signal indicating that the external device is not attempting to communicate with power switching device 6, communication module 20 may cause the signals at connectors 14 to return to their original functionality. For instance, multiplexor 34 may pass feedback signal IS' from driver logic 22 to connector 14C.

In some examples, protocol module 38 may perform one or more actions based on the received data (i.e., the data received from the external device). For instance, protocol module 38 may modify one or more operational settings based on the received data. As one example, protocol module 38 may output a signal that causes driver logic 22 to modify one or more operational settings based on the received data. As discussed above, some example operational setting that may be modified based on the received data include, but are not limited to, a current limit of the power signal, a slew-rate of the power signal, a ratio of a current feedback signal to a current level of the power signal (e.g., $K_{ILIS}$), and one or more fault behavior settings. In this way, techniques of this disclosure may enable the modification of operational settings that, without the availability of a general purpose communication bus, may be unmodifiable.

Figure 5:
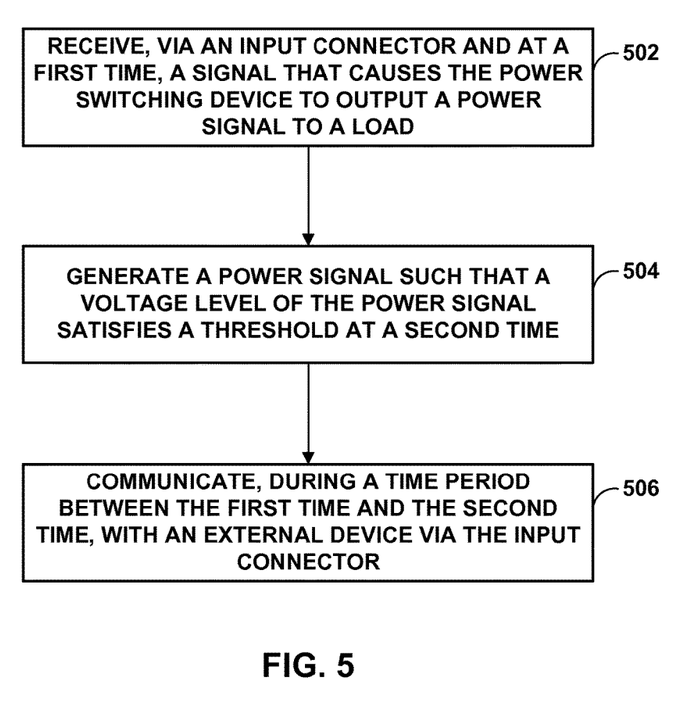
FIG. 5 is a flowchart illustrating exemplary operations of an example power switching device configured to communicate with an external device via one or more connectors that are configured to both carry signals for a general purpose communication bus and operate as signal-specific connectors, in accordance with one or more techniques of this disclosure.

FIG. 5 is a flowchart illustrating exemplary operations of an example power switching device configured to communicate with an external device via one or more connectors that are configured to both carry signals for a general purpose communication bus and operate as signal-specific connectors, in accordance with one or more techniques of this disclosure. For purposes of illustration only, the example operations are described below within the context of power switching device 6 as shown in FIGS. 1 and 3.

In accordance with one or more techniques of this disclosure, power switching device 6 may receive, via an input connector and at a first time, a signal that causes power switching device 6 to output a power signal to a load (502). For instance, hold module 32 of communication module 20 of power switching device 6 may receive, via connector 14A, a logical high signal. Responsive to receiving the logical high signal, hold module 32 may output a logical high signal to driver logic 22 of power switching device 6.

Driver 24 of power switching device 6 may generate a power signal such that a voltage level of the power signal satisfies a threshold at a second time (504). For instance, responsive to receiving a logical high signal from hold module 32, driver logic 22 may output a signal that causes driver 24 to begin generating the power signal. As discussed above, due to one or more properties of driver 24, there may be a delay from the time driver logic 22 outputs signal that causes driver 24 to begin generating the power signal and the time the voltage level of the power signal satisfies the threshold.

Communication module 20 may communicate, during a first time between the first time and the second time, with an external device, such as controller 4, via the input connector (506). In some examples, communication module 20 may communicate in response to receiving, via the input connector, a signal that indicates that the external device is attempting to communicate with power switching device 6. In some examples, the signal that indicates that the external device is attempting to communicate with power switching device 6 may be a binary signal that toggles between logic high and logic low at or above a particular frequency. As discussed above, while the signal at the input connector may toggle, the signal received by driver logic 22 that corresponds to the signal at the input connector may remain constant if the period of toggling (i.e., one over the particular frequency) is less than or equal to the hold period used by hold module 32.

Also as discussed above, in some examples, communication module 20 may communicate with the external device using an N signal communication protocol via N−1 connectors of power switching device 6. For instance, responsive to receiving the signal that indicates that the external device is attempting to communicate with power switching device 6, signal generation module 36 may generate a signal of the N signal communication protocol that is not associated with the N−1 connectors of power switching device 6.

In some examples, responsive to receiving the signal that indicates that the external device is attempting to communicate with power switching device 6, multiplexor 34 may modify operation of one or more of connectors 14. For instance, multiplexor 34 may couple protocol module 38 to connector 14C as opposed to driver logic 22. Additionally, responsive to receiving the signal that indicates that the external device is attempting to communicate with power switching device 6, protocol module 38 may communicate with the external device using a general purpose communication bus with at least one signal of the general purpose communication bus being carried via the input connector. In this way, power switching device 6 may communicate with an external device via one or more connectors that are configured to both carry signals for a general purpose communication bus and operate as signal-specific connectors.

1. A method comprising: receiving, at a first time by a power switching device via an input connector of the power switching device, a signal that causes the power switching device to output a power signal to a load via an output connector of the power switching device, wherein a voltage level of the power signal satisfies a voltage threshold at a second time that is later than the first time; and communicating, by the power switching device and during a time period between the first time and the second time, with an external device via the input connector.

2. The method of example 1, wherein the communicating with the external device comprises: communicating with the external device in response to receiving, by the power switching device via the input connector, a signal that indicates that the external device is attempting to communicate with the power switching device, wherein the signal that indicates that the external device is attempting to communicate with the power switching device is different than the signal that causes the power switching device to output the power signal to the load.

3. The method of any combination of examples 1-2, wherein: the signal that causes the power switching device to output the power signal to the load is a static signal, and the signal that indicates that the external device is attempting to communicate with the power switching device is a dynamic signal.

4. The method of any combination of examples 1-3, wherein: the communicating with the external device comprises communicating with the external device using an N signal communication protocol via N−1 connectors of the power switching device, the method further comprising: responsive to receiving the signal that indicates that the external device is attempting to communicate with the power switching device, generating, by the power switching device, a signal of the N signal communication protocol that is not associated with the N−1 connectors of the power switching device.

5. The method of any combination of examples 1-4, further comprising: using the signal that indicates that the external device is attempting to communicate with the power switching device as a clock signal of the N signal communication protocol.

6. The method of any combination of examples 1-5, wherein the communicating with the external device comprises communicating with the external device via the input connector and a feedback connector.

7. The method of any combination of examples 1-6, further comprising: responsive to receiving, after the second time by the power switching device via a diagnostic connector of the power switching device, a signal that causes the power switching device to modify operation of the feedback connector, outputting, by the power switching device via the feedback connector, a representation of the power signal, wherein the communicating with the external device comprises communicating with the external device via the input connector, the feedback connector, and the diagnostic connector.

8. The method of any combination of examples 1-7, wherein the communicating comprises receiving, by the power switching device and from the external device, data, the method further comprising modifying one or more operational settings of the power switching device based on the data.

9. The method of any combination of examples 1-8, wherein the one or more operational settings include one or more of: a current limit of the power signal, a slew-rate of the power signal, a ratio of a current feedback signal to a current level of the power signal, and one or more fault behavior settings.

10. A power switching device comprising: an input connector configured to receive, at a first time, a signal that causes the power switching device to output a power signal; a driver configured to generate the power signal, wherein a voltage level of the power signal satisfies a voltage threshold at a second time that is later than the first time; an output connector configured to output the power signal to a load; and a communication module configured to communicate, during a time period between the first time and the second time, with an external device via the input connector.

11. The power switching device of example 10, wherein the communication module is configured to communicate with the external device in response to receiving, via the input connector, a signal that indicates that the external device is attempting to communicate with the power switching device, wherein the signal that indicates that the external device is attempting to communicate with the power switching device is different than the signal that causes the power switching device to output the power signal to the load.

12. The power switching device of any combination of examples 10-11, wherein the communication module is configured to communicate with the external device using an N signal communication protocol via N−1 connectors of the power switching device, wherein the communication module is further configured to generate, responsive to receiving the signal that indicates that the external device is attempting to communicate with the power switching device, a signal of the N signal communication protocol that is not associated with the N−1 connectors of the power switching device.

13. The power switching device of any combination of examples 10-12, wherein the communication module is further configured to use the signal that indicates that the external device is attempting to communicate with the power switching device as a clock signal of the N signal communication protocol.

14. The power switching device of any combination of examples 10-13, wherein the communication module is configured to communicate with the external device via the input connector and a feedback connector of the power switching device.

15. The power switching device of any combination of examples 10-14, wherein: the driver is further configured to output, via the feedback connector, a representation of the power signal in response to receiving, via a diagnostic connector of the power switching device and after the second time, a signal that causes the power switching device to modify operation of the feedback connector, and the communication module is further configured to communicate with the external device via the input connector, the feedback connector, and the diagnostic connector.

16. The power switching device of any combination of examples 10-15, wherein: the communication module is configured to communicate by at least receiving, from the external device, data, and the communication module is further configured to modify one or more operational settings of the power switching device based on the data.

17. The power switching device of any combination of examples 10-16 wherein the one or more operational settings include one or more of: a current limit of the power signal, a slew-rate of the power signal, a ratio of a current feedback signal to a current level of the power signal, and one or more fault behavior settings.

18. A power switching device comprising: means for generating a power signal, wherein a voltage level of the power signal satisfies a voltage threshold at a second time that is later than a first time; means for receiving, at the first time, a signal that causes the power switching device to output the power signal; means for outputting the power signal to a load; and means for communicating, during a time period between the first time and the second time, with an external device via the means for receiving.

19. The power switching device of example 18, wherein: the means for communicating comprise means for communicating in response to receiving, via the means for receiving, a signal that indicates that the external device is attempting to communicate with the power switching device, and the signal that indicates that the external device is attempting to communicate with the power switching device is different than the signal that causes the power switching device to output the power signal to the load.

20. The power switching device of any combination of examples 18-19, wherein the means for communicating comprise means for communicating with the external device using an N signal communication protocol via N−1 connectors of the power switching device, the power switching further comprising: means for generating, responsive to receiving the signal that indicates that the external device is attempting to communicate with the power switching device, a signal of the N signal communication protocol that is not associated with the N−1 connectors of the power switching device 21. The power switching device of example 18, further comprising means for performing any combination of the method of examples, 1-9.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules, or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

The invention claimed is:

1. A method comprising:
receiving, at a first time by a power switching device via an input connector of the power switching device, a signal that causes the power switching device to output a power signal to a load via an output connector of the power switching device, wherein a voltage level of the power signal satisfies a voltage threshold at a second time that is later than the first time; and communicating, by the power switching device and during a time period between the first time and the second time, with an external device via the input connector.

2. The method of claim 1, wherein the communicating with the external device comprises:
communicating with the external device in response to receiving, by the power switching device via the input connector, a signal that indicates that the external device is attempting to communicate with the power switching device, wherein the signal that indicates that the external device is attempting to communicate with the power switching device is different than the signal that causes the power switching device to output the power signal to the load.

3. The method of claim 2, wherein:
the signal that causes the power switching device to output the power signal to the load is a static signal, and
the signal that indicates that the external device is attempting to communicate with the power switching device is a dynamic signal.

4. The method of claim 2, wherein:
the communicating with the external device comprises communicating with the external device using an N signal communication protocol via N−1 connectors of the power switching device, the method further comprising:
responsive to receiving the signal that indicates that the external device is attempting to communicate with the power switching device, generating, by the power switching device, a signal of the N signal communication protocol that is not associated with the N−1 connectors of the power switching device.

5. The method of claim 4, further comprising:
using the signal that indicates that the external device is attempting to communicate with the power switching device as a clock signal of the N signal communication protocol.

6. The method of claim 1, wherein the communicating with the external device comprises communicating with the external device via the input connector and a feedback connector.

7. The method of claim 6, further comprising:
responsive to receiving, after the second time by the power switching device via a diagnostic connector of the power switching device, a signal that causes the power switching device to modify operation of the feedback connector, outputting, by the power switching device via the feedback connector, a representation of the power signal, wherein the communicating with the external device comprises communicating with the external device via the input connector, the feedback connector, and the diagnostic connector.

8. The method of claim 1, wherein the communicating comprises receiving, by the power switching device and from the external device, data, the method further comprising modifying one or more operational settings of the power switching device based on the data.

9. The method of claim 8, wherein the one or more operational settings include one or more of:
a current limit of the power signal, a slew-rate of the power signal, a ratio of a current feedback signal to a current level of the power signal, and one or more fault behavior settings.

10. A power switching device comprising:
an input connector configured to receive, at a first time, a signal that causes the power switching device to output a power signal;

a driver configured to generate the power signal, wherein a voltage level of the power signal satisfies a voltage threshold at a second time that is later than the first time;
an output connector configured to output the power signal to a load; and
a communication module configured to communicate, during a time period between the first time and the second time, with an external device via the input connector.

11. The power switching device of claim 10, wherein the communication module is configured to communicate with the external device in response to receiving, via the input connector, a signal that indicates that the external device is attempting to communicate with the power switching device, wherein the signal that indicates that the external device is attempting to communicate with the power switching device is different than the signal that causes the power switching device to output the power signal to the load.

12. The power switching device of claim 11, wherein the communication module is configured to communicate with the external device using an N signal communication protocol via N−1 connectors of the power switching device, wherein the communication module is further configured to generate, responsive to receiving the signal that indicates that the external device is attempting to communicate with the power switching device, a signal of the N signal communication protocol that is not associated with the N−1 connectors of the power switching device.

13. The power switching device of claim 12, wherein the communication module is further configured to use the signal that indicates that the external device is attempting to communicate with the power switching device as a clock signal of the N signal communication protocol.

14. The power switching device of claim 10, wherein the communication module is configured to communicate with the external device via the input connector and a feedback connector of the power switching device.

15. The power switching device of claim 14, wherein:
the driver is further configured to output, via the feedback connector, a representation of the power signal in response to receiving, via a diagnostic connector of the power switching device and after the second time, a signal that causes the power switching device to modify operation of the feedback connector, and the communication module is further configured to communicate with the external device via the input connector, the feedback connector, and the diagnostic connector.

16. The power switching device of claim 10, wherein:
the communication module is configured to communicate by at least receiving, from the external device, data, and the communication module is further configured to modify one or more operational settings of the power switching device based on the data.

17. The power switching device of claim 8, wherein the one or more operational settings include one or more of:
a current limit of the power signal, a slew-rate of the power signal, a ratio of a current feedback signal to a current level of the power signal, and one or more fault behavior settings.

18. A power switching device comprising:
means for generating a power signal, wherein a voltage level of the power signal satisfies a voltage threshold at a second time that is later than a first time;
means for receiving, at the first time, a signal that causes the power switching device to output the power signal;
means for outputting the power signal to a load; and means for communicating, during a time period between the first time and the second time, with an external device via the means for receiving.

19. The power switching device of claim 18, wherein:
the means for communicating comprise means for communicating in response to receiving, via the means for receiving, a signal that indicates that the external device is attempting to communicate with the power switching device, and the signal that indicates that the external device is attempting to communicate with the power switching device is different than the signal that causes the power switching device to output the power signal to the load.

20. The power switching device of claim 19, wherein the means for communicating comprise means for communicating with the external device using an N signal communication protocol via N−1 connectors of the power switching device, the power switching further comprising:
means for generating, responsive to receiving the signal that indicates that the external device is attempting to communicate with the power switching device, a signal of the N signal communication protocol that is not associated with the N−1 connectors of the power switching device.

* * * * *